(12) United States Patent
Bell et al.

(10) Patent No.: US 7,057,394 B1
(45) Date of Patent: Jun. 6, 2006

(54) CHASSIS ELECTRICAL SYSTEM TESTER (75) Inventors: Joseph A. Bell, Markle, IN (US); Harry R. Wilson, Jr., Auburn, IN (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 0 days.

(21) Appl. No.: 11/052,410

(22) Filed: Feb. 7, 2005

(51) Int. Cl.
*G01R 31/02* (2006.01)
(52) U.S. Cl. .................................... 324/503
(58) Field of Classification Search ........... 324/555, 324/556, 503
See application file for complete search history.

(56) References Cited

U.S. PATENT DOCUMENTS

| 4,002,972 A | 1/1977 | Konrad et al. |
| 4,251,765 A | 2/1981 | Mears |
| 4,274,144 A * | 6/1981 | Meyer et al. ............... 701/103 |
| 4,870,347 A | 9/1989 | Cicerone |
| 6,297,646 B1 * | 10/2001 | Lang et al. ................. 324/556 |
| 2004/0054503 A1 * | 3/2004 | Namaky ..................... 702/183 |

* cited by examiner

*Primary Examiner*—Vincent Q. Nguyen
(74) *Attorney, Agent, or Firm*—Jeffrey P. Calfa; Dennis Kelly Sullivan; Susan L. Lukasik (57) ABSTRACT

A portable emulator of a bus body electrical system provides for chassis electrical testing. The portable emulator/tester provides indicator/load circuits and switches which operate as outputs from and inputs to the bus electrical system. The emulator may be connected to a vehicle chassis prior to mating of the chassis with the body by the test connectors that are keyed to those used for the body.

4 Claims, 8 Drawing Sheets

CHASSIS ELECTRICAL SYSTEM TESTER

BACKGROUND OF THE INVENTION

1. Technical Field

The present invention relates generally to motor vehicle assembly and more particularly to electrical testing of a motor vehicle chassis before mating of a body to the chassis.

2. Description of the Problem

The electrical system of a motor vehicle such as a school bus can be difficult to troubleshoot on the assembly line. In the case of school busses, the bus body is normally assembled on one assembly line and the chassis on another. Body and chassis are then mated. The procedure can make it difficult and time consuming to access electrical devices such as wiring connectors to troubleshoot an electrical problem discovered after mating.

The electrical connections between the chassis and the body are often the ideal location to start when troubleshooting a bus electrical problem. This serves to isolate the problem as a body or chassis issue. However, opening one of the multi-terminal connections between body and chassis to test a circuit can create other problems which mask the root cause of the problem. In addition, using a test light or jumper wire connected to battery negative (i.e. ground) or battery positive can cause damage to the vehicle electrical system, especially when a body systems computer is used to control lights, doors, etc. Probing the wrong connector cavity can result in unexpected operation or damage to electrical system components. If the vehicle has a body systems computer, using a voltmeter to perform this troubleshooting can also result in an incorrect diagnosis due to power MOSFET leakage current. Additionally, the wiring in the school bus body is often limited to a small number of vehicles due to State and local requirements. This leads to still further difficulties in troubleshooting.

SUMMARY OF THE INVENTION

The invention provides a portable emulator of a bus body electrical system for chassis electrical testing. The portable emulator/tester provides indicators and switches which operate as outputs from and inputs to the bus electrical system. The emulator may be connected to a vehicle chassis prior to mating of the chassis with the body by test connectors that are keyed to those used for the body. This allows easy and isolated testing of the chassis electrical system prior to mating of the body to the chassis for isolation of chassis electrical problems. A plurality of switches installed on the emulator provide correct input voltage levels (power or ground) to the appropriate chassis electrical system inputs. LED indicators provide confirmation of outputs of both high side and low side chassis electrical system outputs.

Where, as is typical, the vehicle is equipped with a body computer, the body computer outputs may utilize high-side power MOSFETs with low current detection. For these outputs, the emulator includes a power resistor in parallel with the low-current LED indicator. This results in a large enough load to prevent the body computer from falsely detecting a fault. By comparison, a test light or similar device such as a voltmeter will not draw enough current to prevent logging as a fault. The emulator also provides visual confirmation of chassis ignition, accessory, and chassis reference ground through LEDs. Additionally, the graphic on the face of the enclosure indicates connector cavity information further reducing diagnostic time by eliminating the need to consult a schematic for this information.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
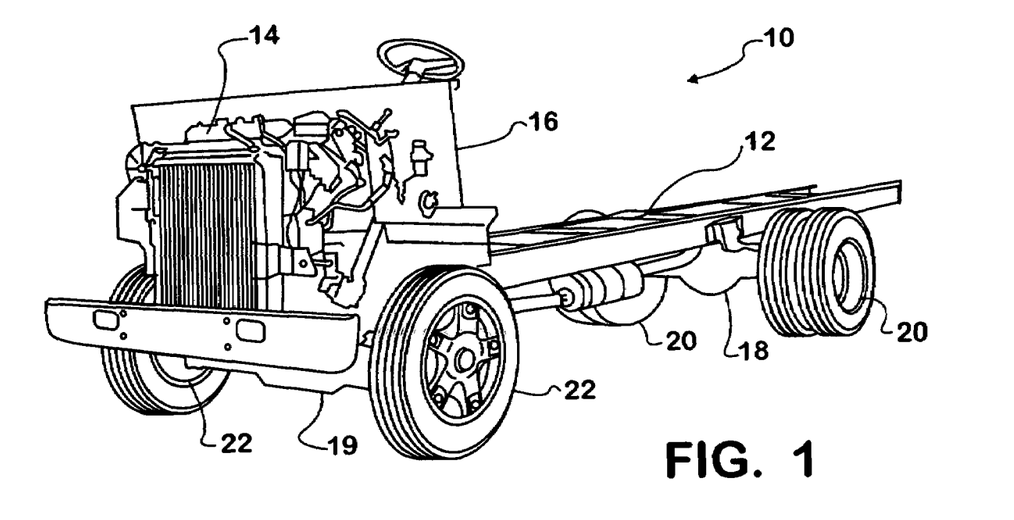
FIG. 1 is a perspective view of a school bus chassis.
Figure 2:
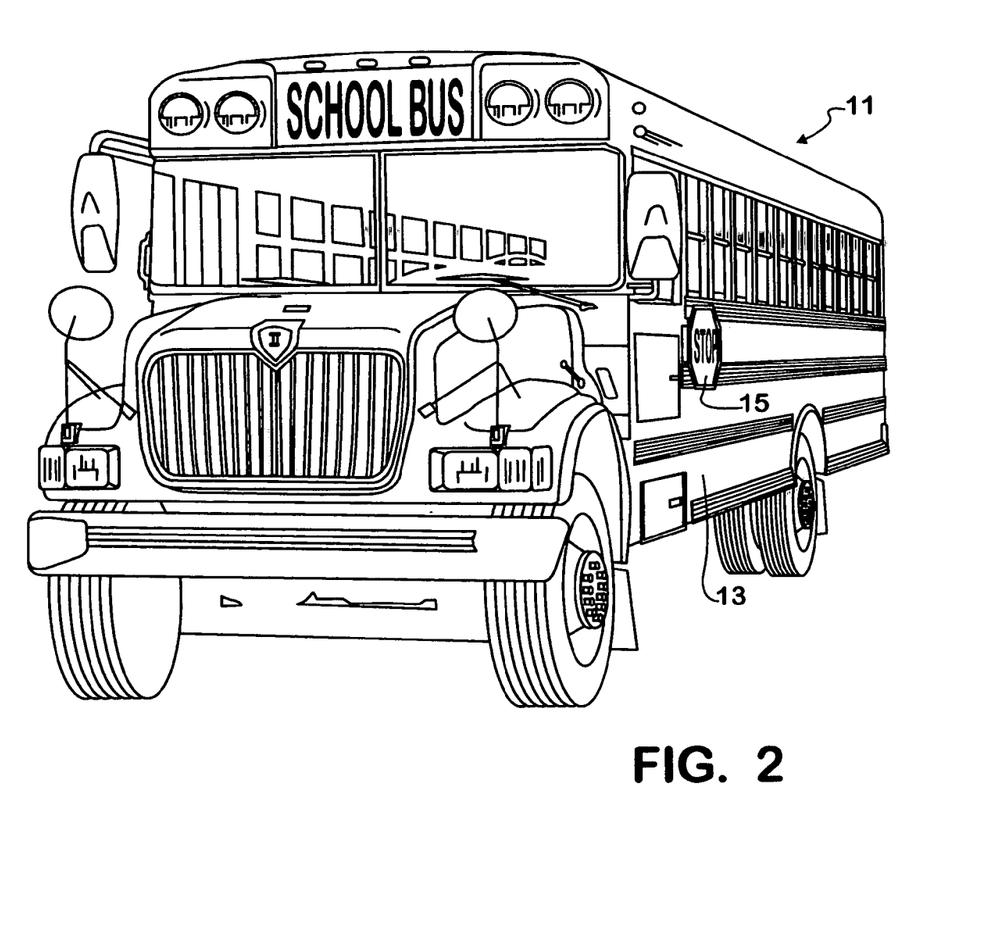
FIG. 2 is a perspective view of a school bus.

Referring to the drawings and in particular referring to FIG. 1 a bus chassis 10 is illustrated which may be mated with a bus body to build a school bus 11 (as shown in FIG. 2). Chassis 10 comprises a frame 12 supported from a rear axle 18 and a front, steering axle 19. Wheels 20 and 22 are mounted at opposite ends of axles 18 and 19. A firewall 16 is mounted toward the front of frame 12 behind an engine 14. Most of the vehicle's electrical system is installed on chassis 10 near or in an engine compartment surrounding engine 14 and the back wall of which is formed by the dash panel/firewall 16.

In FIG. 2 bus body 13 has been mated to the chassis to complete assembly of school bus 11. Bus body 13 may include various warning lights, doors, wheelchair lifts, a swing arm 15, and the like, all of which are electrically connected to the chassis 10. The chassis electrical system which controls these devices is also installed on chassis 10.

Figure 3:
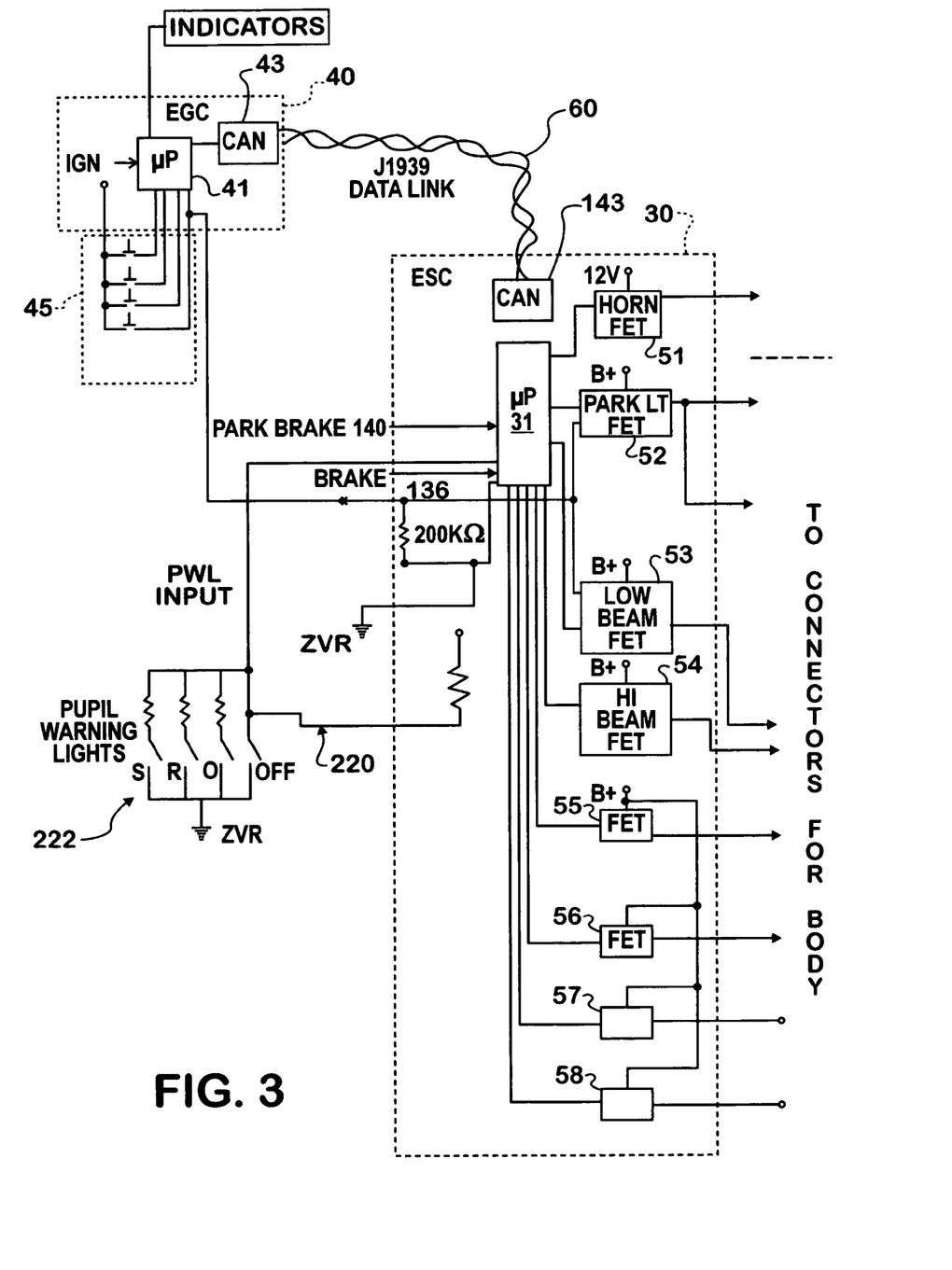
FIG. 3 is a high level schematic of a chassis control network and of the lighting connections for an electrical system controller.

FIG. 3 is a partial circuit schematic of a chassis electrical control system including an electrical gauge controller (EGC) 40, an electrical system controller (ESC) 30 and representative output drivers from the ESC for some of the plurality of body electrical circuits energized under the control of the ESC. Several power switching Field Effect Transistors (MOSFETs) 51, 52, 53, 54, 55 and 56 are used for energizing various chassis or body electrical circuits. Inputs 57, 58 represent inputs for indicators activation of which is controlled by ESC 30, usually by commands issued over J1939 datalink 60 for receipt and action by EGC 40. Fewer than the number of MOSFETs required are illustrated because the specific circuit element is simply repeated up to the number of circuits for which support is required. ESC 30 is a programmable body system computer used to control many vehicle electrical system functions, most of which are installed on the vehicle chassis and which are not shown for the sake of simplicity. ESC 30 is based on a microprocessor 31 which executes programs and which controls switching of the plurality of power MOSFETs 52, 53, 54, 55 and 56 used to actuate body electrical circuits such as vehicle exterior lights. Among these circuits are those for the park lights (through MOSFET 52), the headlamp low beam energization circuit (through MOSFET 53) and a high beam headlamp circuit (through MOSFET 54). MOSFETS 55, 56 represent MOSFETS which may be used to control wheel chair lifts, pupil warning lights (PWL) and other electrical equipment installed on the bus body. Inputs to ESC 30 from the body are simulated by the emulator of the present invention using inputs such as inputs 57, 58. It will be understood that illustration of MOSFETS 52–56 is intended as representative only and that the actual number of such MOSFETS may greatly exceed the number shown.

On an assembled vehicle microprocessor 31 of ESC 30 can supply activation signals for all of the lamps and other electrical equipment installed on the body 13. Inputs to ESC 30 come from various sources. Primary among these is the electric gauge controller (EGC) 40, which provides local control and a controller area network interface over the instruments and switches installed on instrument panel 20. EGC 40 communicates with ESC 30 over a controller area network (CAN) datalink (bus 60) and two CAN interfaces 43, 143. CAN controllers 43 and 143 located with EGC 40 and ESC 30, respectively, implement the network protocols and data packet decoding. EGC 40 is based on a microprocessor 41 but includes only limited and typically fixed programming. EGC 40 handles an array of microswitches 45, and is programmed to provide manual control over headlights, park lights, marker lights, etc. Sources of direct inputs to ESC 30 include a park brake 140, brake 136 and a pupil warning light (PWL) resistive network 222. The resistor network 222 is adapted from switches supplied to implement a speed control system. Naturally, other arrangements may be made for turning on the PWL. Other controllers, such a transmission controller, maybe connected to datalink 60 and may provide signals on which ESC 30 acts to generate operations of devices installed on the bus. In addition, ESC 30 may receive signals from an array of switches connected to ESC 30 by other types of busses. In some cases MOSFETs from ESC 30 may in turn control a relay installed on the vehicle's chassis. In any event, no modification of the chassis is intended by the invention.

Figure 4:
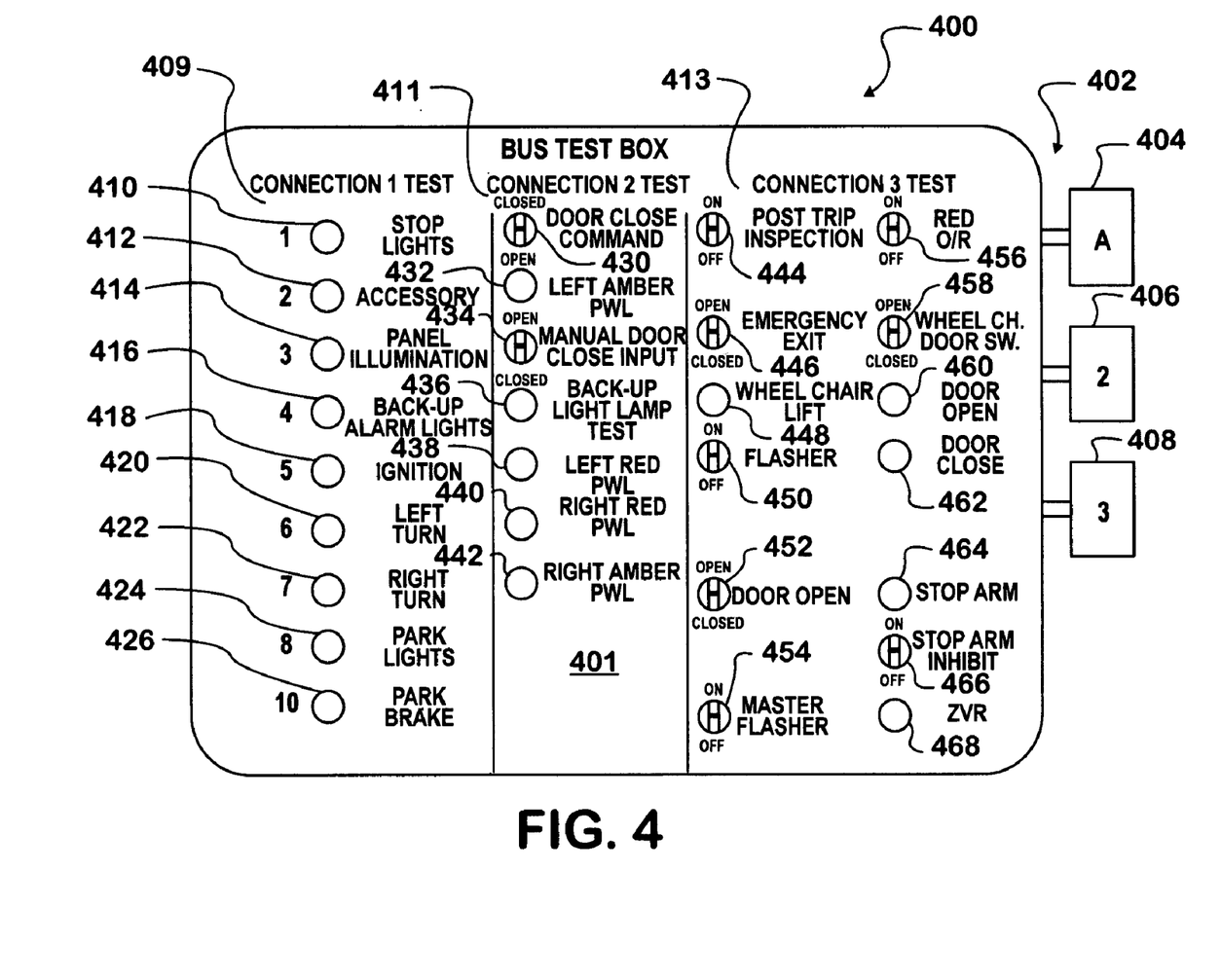
FIG. 4 is a view of a chassis electrical system test box.

FIG. 4 illustrates a control panel 401 for a portable emulator 400 of a bus body electrical system for chassis electrical testing. The portable emulator/tester 400 provides a housing on which indicators and switches are disposed. The indicators reflect the status of output signals from a chassis electrical system and the switches operate as inputs to the chassis electrical system from the bus body. In combination this allows examination of the electrical responses of the chassis to the bus body without attachment of the bus body. Portable emulator 400 operates as a correctly wired and configured bus body electrical system will. The emulator 400 is connected to a vehicle chassis prior to mating of the chassis with the body. A short harness 402 provides test connectors 404, 406, 408 corresponding to body connectors and which are identical to those used for the body. This allows easy and isolated testing of the chassis electrical system prior to mating of the body to the chassis for easier diagnosis of chassis electrical problems. A plurality of switches installed on the emulator provides correct input voltage levels (power or ground) to the appropriate chassis electrical system inputs. LED indicators provide confirmation of outputs of both high side and low side chassis electrical system outputs.

Panel 401 includes a graphic overlay which indicates division 409, 411 and 413 of the switches and LED indicators installed on the panel among one of the three electrical connectors 404, 406 or 408. Among the Connection 1 Test division 409 are a stop lights LED indicator 410, an unspecified accessory-on LED indicator 412, a panel illumination indicator 414, back-up alarm lights 416 (typically activated through ESC 30 from a transmission controller (not shown), an ignition on indicator 418, a left turn on indicator 420, a right turn indicator 422, park lights 424 and a park brake 426. All of the indicators of division 409 correspond to connector 404. Numbers placed on the panel adjacent the indicators correspond to pin numbers in the connectors. Each connector has a unique pin arrangement to prevent connection of the wrong connectors. Connectors, and overlays, may be varied by model of bus. Obviously, then, although much of the bus body circuitry will carry over from year to year, the emulation circuitry described below is exemplary of a typical bus and not universal.

The second division 411 includes a door closed command switch 430, a left amber PWL indicator 432, a manual door close input switch 434, a back-up light lamp test indicator 436, a left red PWL indicator 438, a right red PWL indicator 440 and a right amber PWL indicator 442. The indicators and switches of the second division 411 correspond to connector 406.

The third division 413 of the graphic overlay of panel 401 includes a post trip inspection switch 444, an emergency exit 446, a wheel chair lift indicator 448, a flasher switch 450, a door open switch 452, a master flasher switch 454, a red O/R switch 456, a wheel chair door switch 458, a door open indicator 460, door close indicator 462, a stop arm indicator 464, a stop arm inhibit switch 466 and a zero volt return indicator 468.

Where, as is typical and as illustrated in FIG. 3, the vehicle is equipped with a body computer, the body computer outputs may utilize high-side power MOSFETs with low current detection. For these outputs, the emulator includes a power resistor in parallel with the low-current LED indicator. This results in a large enough load to prevent the body computer from falsely detecting a fault. By comparison, a test light or similar device such as a voltmeter will not draw enough current to prevent logging as a fault. The emulator also provides visual confirmation of chassis ignition, accessory, and chassis reference ground through LEDs. Additionally, the graphic on the face of the enclosure indicates connector cavity information further reducing diagnostic time by eliminating the need to consult a schematic for this information.

Figure 5:
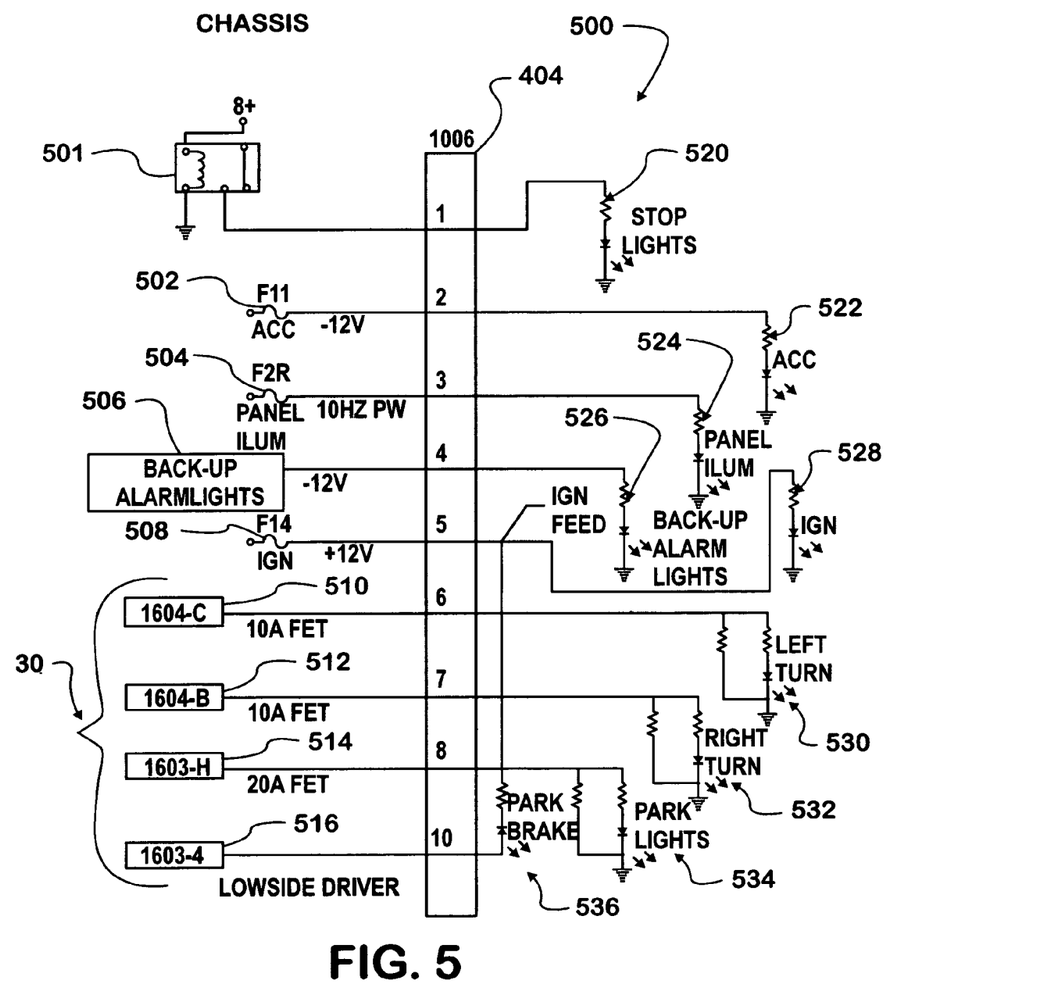
FIGS. 5–8 are circuit schematics of the chassis electrical system test box of FIG. 4.

FIG. 5 illustrates circuitry 500 corresponding to the first division 409 of emulator 400. Most of the indicator circuitry comprise a resistor and an LED indicator connected in series. For some circuits where additional power dissipation is required to avoid indication of a fault to ESC 30, a resistor is added in parallel to the series resistor and LED indicator. Stop light emulation circuitry 520 is an example of the first case with a series connected resistor and LED connected to pin 1 of connector 404. a non-specified accessory 522 connected to pin 2, panel illumination emulation circuitry 524, back-up alarm lights emulation circuitry 526 and ignition indication emulation circuitry 528 are all represented by a series connected resistor and LED which are connected to pins 2, 3, 4 and 5, respectively. Left turn emulation circuitry 530, right turn emulation circuitry 532 and park lights emulation circuitry 534 all comprise a series connected resistor and LED with the combination connected in parallel with a second resistor. A park brake emulation circuit 536 is energized between the ignition indicator feed connection from pin 5 and a low side driver 516, and is representative of an LED and resistor connected in series. Connector 404 represents a division between emulation circuit and chassis electrical components which include a relay 501 for energizing stop lights, fuses 502, 504, for connection, respectively, to the accessory and to panel illumination lighting. An FET 506 is to provide power for a back-up alarm lights. a fuse 508 provides for connection to the ignition indicator. MOSFETS 510, 512 and 514 provide energy for left turn, right turn and park lights, respectively. Low side driver 516 provides a ground return for park brake circuitry 536. Most circuits are of general application and can be relabeled to represent a change of function.

Figure 6:
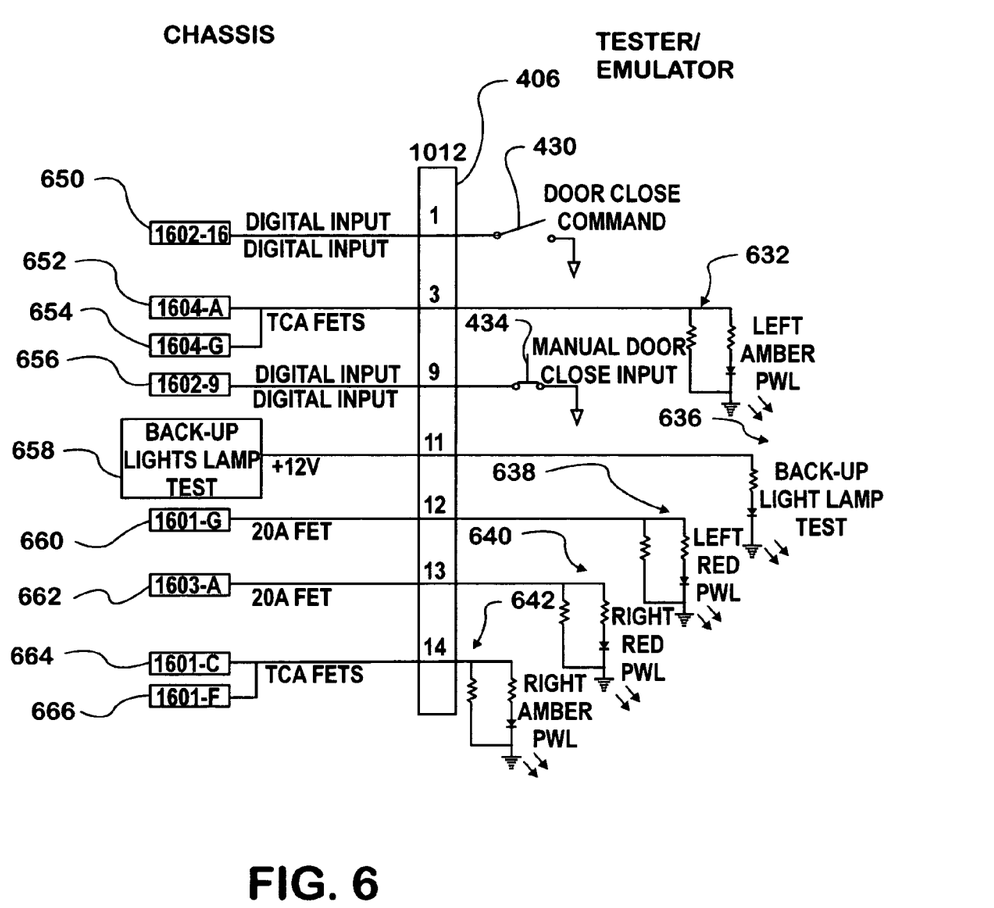

FIG. 6 illustrates pairings made by connector 406. For pin 1 an ESC 30 digital input 650 is matched with a door close command switch 430. Pin 3 matches 10 amp output FETs 652 and 654 with a left amber PWL emulation circuit 632 comprising a series connected resistor and LED with a parallel resistor. Pin 9 matches an ESC 30 digital input 656 with a manual door close input switch 434. Pin 11 matches a back-up lights lamp voltage source with back up light test emulation circuit 636. Pin 12 matches 20 amp source FET 662 with left red light PWL 638, which in turn is a resistor connected in parallel with a series connected resistor and LED. Pin 13 matches 20 amp source FET 664 with the right red light PWL 640, comprising in turn a resistor connected in parallel with a series connected resistor and LED. Lastly, pin 14 matches FET sources 664, 666, with a right amber PWL emulation circuit 642, comprising a resistor connected in parallel with a series connected resistor and LED.

Figure 7:
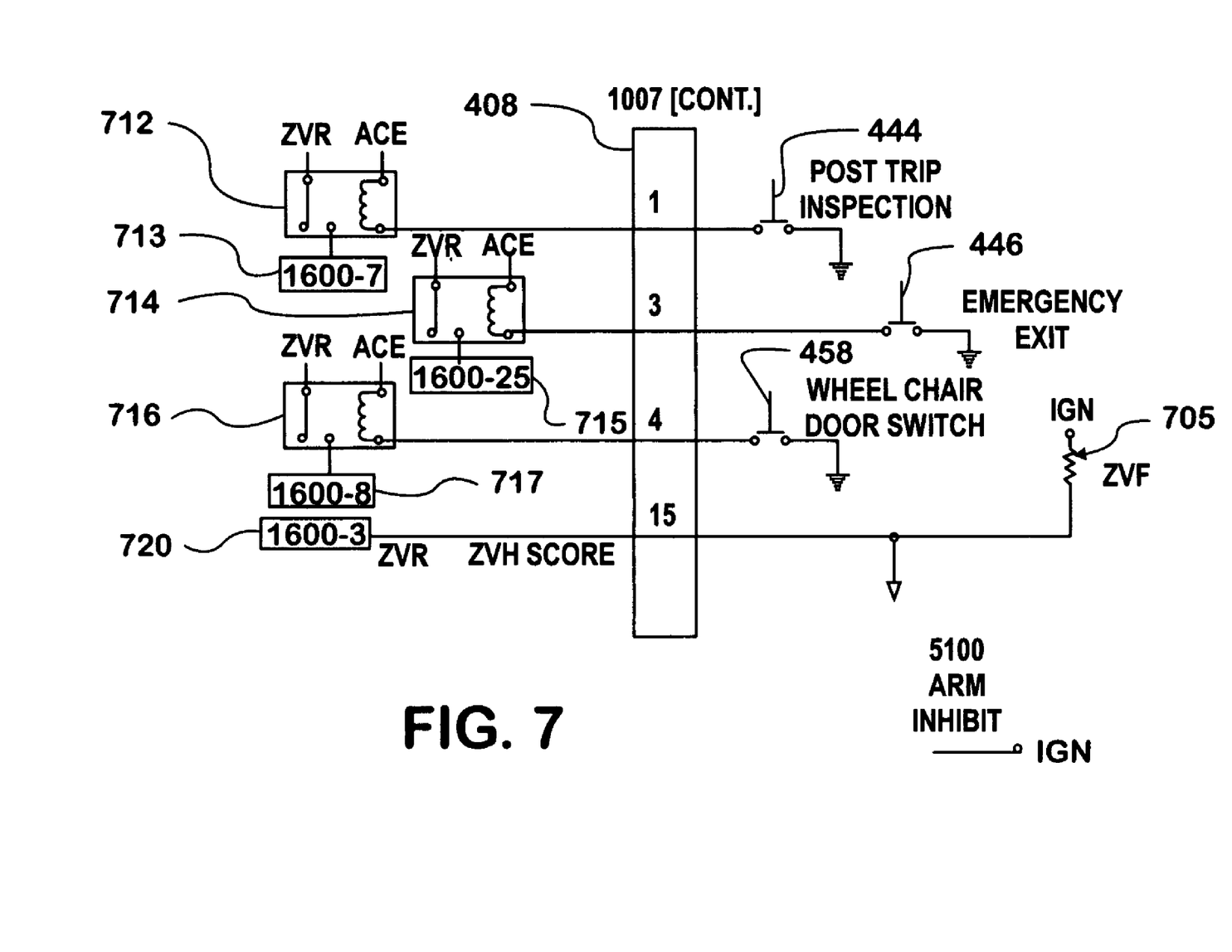
Figure 8:
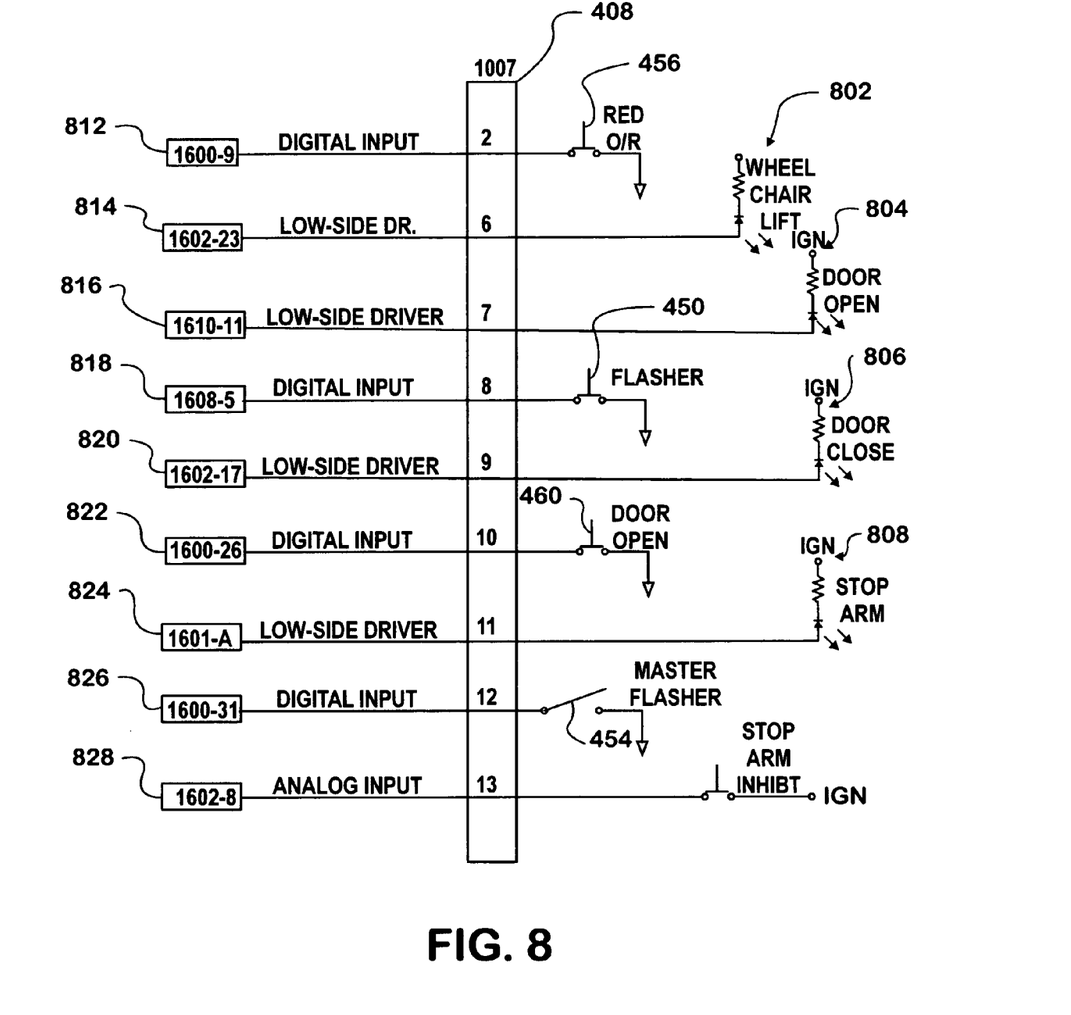

FIGS. 7 and 8 illustrate the connections made by connector 408 between the chassis electrical system and the emulator. Pin 1 connects a post trip inspection switch 444 in the emulator to a relay 712 which provides an output to a digital input 713. Pin 3 connects an emergency exit switch 446 to an activation pin on relay 714, which in turn has an output pin connected to an input 715. Pin 4 connects a wheel chair door switch 458 to an activation input pin of relay 716, the output of which is connected to an input 717. Finally, pin 15 connects a zero volt return output 720 to a indication illumination circuit 705 comprising a resistor and an LED connected between the pin and a voltage source (Ign).

Pin 2 connects a Red O/R 456 to a digital input 812. Pin 6 connects a low side driver 814 to a wheel chair lift indicator light 802. Pin 7 connects a low side driver output 816 to a door open indicator light 804. Pin 8 connects a flasher switch 450 to a digital input 818. Pin 9 connects a low side driver 820 to a door close indicator 806. Pin 10 connects a door open emulation switch 460 to a digital input 822. Pin 11 connects a low side driver 824 to a stop arm indicator 808. Pin 12 connects a master flasher emulation switch 454 to a digital input 826. Pin 13 connects a stop arm inhibit emulation switch 466 to an analog input 828 for ESC 30.

The invention provides a portable box with switches (either momentary contact or latching, chosen to match the switch functionality of the applicable body wiring switch), LED indicator lights and power dissipating resistors. The portable box has a short harness which allows connection to the chassis electrical system. The device also has a single chassis ground wire used to provide ground for LEDs and resistors.

While the invention is shown in only one of its forms, it is not thus limited but is susceptible to various changes and modifications without departing from the spirit and scope of the invention.

What is claimed is:

1. Apparatus for testing of vehicle electrical systems, comprising:
    a chassis electrical control system including a body computer having a plurality of output connections and a plurality of input connections for connection to vehicle body electrical systems, the chassis electrical control system being electrically isolated from a vehicle body electrical system; and
    a portable vehicle body electrical system emulator including,
    a housing,
    a harness extending from the housing, the harness terminating in a plurality of test connectors for connection to the chassis electrical control system,
    a plurality of visual indicators mounted on the housing,
    a plurality of switches mounted on the housing,
    a plurality of load emulation circuits, one being associated with and including an illumination element for each visual indicator, the plurality of load emulation circuits including a power dissipating element, and
    a plurality of input emulation circuits, one being associated with and including each switch, the plurality of input emulation circuits providing emulation of switches installed on a vehicle body.

2. Apparatus for testing of vehicle electrical systems as set forth in claim 1, further comprising:
    a replaceable graphic overlay on a face of the housing; and
    the plurality of switches and visual indicators being located on the same face of the housing as the graphic, with the graphic overlay including indicia marking the switches and visual indicators as belonging in groups.

3. Apparatus for testing of vehicle electrical systems as set forth in claim 2, further comprising:
    each group of switches and visual indicators being associated with a particular test connector.

4. Apparatus for testing of vehicle electrical systems as set forth in claim 1, further comprising:
    selected load emulation circuits, intended for connection to a high power side field effect transistor, comprising in parallel, a resistor and a series connected resistor and light emitting diode.

* * * * *